(12) United States Patent
Minato et al.

(10) Patent No.: US 6,717,175 B2
(45) Date of Patent: Apr. 6, 2004

(54) SEMICONDUCTOR LASER DEVICE AND METHOD FOR MANUFACTURING THE SAME

(75) Inventors: Ryuichiro Minato, Tokyo (JP); Takahiro Ono, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 10/255,919

(22) Filed: Sep. 26, 2002

(65) Prior Publication Data

US 2003/0059969 A1 Mar. 27, 2003

(30) Foreign Application Priority Data

Sep. 27, 2001 (JP) ........................................ 2001-297116

(51) Int. Cl.[7] ...................... H01L 29/06; H01L 31/072; H01L 31/109; H01L 31/0328; H01L 31/0336
(52) U.S. Cl. .......................................... 257/22; 257/201
(58) Field of Search ........................... 257/13, 14, 22, 257/37, 190, 191, 201, 744

(56) References Cited

U.S. PATENT DOCUMENTS 5,404,027 A * 4/1995 Haase et al.
6,195,374 B1 * 2/2001 Kidiguchi et al.

* cited by examiner

*Primary Examiner*—Phuc T Dang
(74) *Attorney, Agent, or Firm*—Oblon, Spivak, McClelland, Maier & Neustadt, P.C.

(57) ABSTRACT

A semiconductor laser device is provided in which compositions of a lower optical confinement layer and an upper optical confinement layer are continuously changed in a thickness direction and the change in composition is reverse with respect to an active layer. This semiconductor laser device has a layered structure in which a lower cladding layer, a lower optical confinement layer, an active layer of quantum well structure, an upper optical confinement layer, and an upper cladding layer are stacked in this order on a substrate, wherein both the lower optical confinement layer and the upper optical confinement layer are made of quaternary compound semiconductors with a composition continuously changed in a thickness direction, and a crystal layer obtained as a result of the control of the supply flow rate of the minute gas source is interposed in at least one of the interfaces between the lower cladding layer and the lower optical confinement layer, between the lower optical confinement layer and the active layer, between the active layer and the upper optical confinement layer, and between the upper optical confinement layer and the upper cladding layer.

4 Claims, 9 Drawing Sheets

SEMICONDUCTOR LASER DEVICE AND METHOD FOR MANUFACTURING THE SAME

BACKGROUND

1. Field of the Invention

The present invention relates to a semiconductor laser device in which an active layer having a quantum well structure is sandwiched between a lower optical confinement layer and an upper optical confinement layer, and a method of manufacturing the semiconductor laser device by using the metalorganic chemical vapor deposition method (MOCVD method). More particularly, the present invention relates to a semiconductor laser device in which the composition of the semiconductor material constituting the upper and lower optical confinement layers is continuously changed in a thickness direction of the layers, and a method of manufacturing the semiconductor laser device by using the MOCVD method.

2. Prior Art

In a laser device in which a multiple quantum well (MQW) structure is adopted in the active layer, a threshold current is at a low level, and high optical power operation is possible. And in general, the upper optical confinement layer and the lower optical confinement layer each having the SCH structure (separate-confinement-heterostructure) are provided on both (upper and lower) surfaces of the active layer by means of the heterojunction, thereby improving the carrier injection efficiency and the confinement effect of laser light oscillated in the active layer. Thus, the external differential quantum efficiency of the laser device is enhanced and the high optical power operation can be achieved.

As SCH structures for use in such a case, the following structures are designed. That is, the SCH structure obtained by stacking the layers made of the same kind of semiconductor materials having different composition ratios by means of the heterojunction while changing the composition ratios by stages, and the SCH structure obtained by stacking the same kind of semiconductor materials while continuously changing the composition ratios thereof have been designed.

Of these SCH structures, if the SCH structure in which the composition of the material thereof is continuously changed in the thickness direction is employed, the carrier injection efficiency to the active layer is enhanced, and larger optical confinement effect can be obtained. In addition, it is known that since the optical confinement layer does not contain the heterojunction interface causing the crystal degradation, the advantages that the reliability at the time of the high optical power operation can be improved can be obtained.

Figure 1:
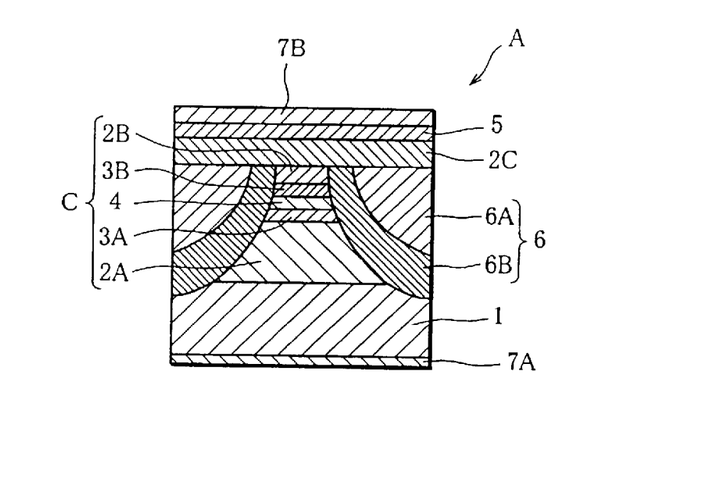
FIG. 1 is a sectional view of the laser device A having the layered structure C.
Figure 2:
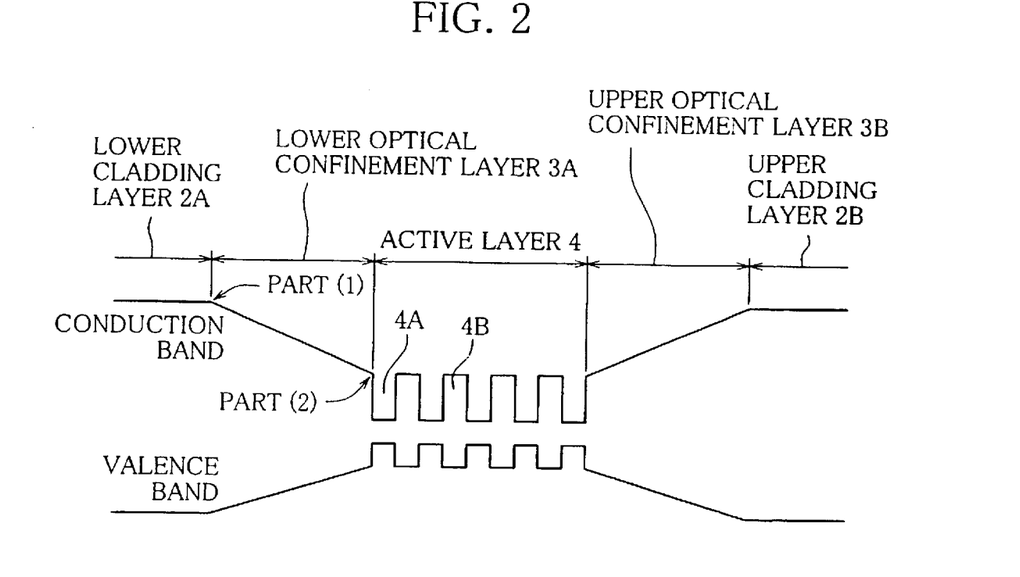
FIG. 2 is a bandgap energy diagram of the conventional layered structure C in the laser device A.

A laser device A serving as an example of the laser device in which the lower optical confinement layer and the upper optical confinement layer with the latter SCH structure are formed is shown in FIG. 1. Also, a diagram representing a conventional energy band in a layered structure C in the laser device A is shown in FIG. 2.

In this laser device A, a lower cladding layer 2A with a thickness of 500 nm and made of n-InP is stacked on a substrate 1 made of, for example, n-InP. On the lower cladding layer 2A, a lower optical confinement layer 3A made of InGaAsP, an active layer 4 with the MQW structure made of InGaAsP/InGaAs, an upper optical confinement layer 3B made of InGaAsP, and an upper cladding layer 2B with a thickness of 500 nm and made of p-InP (all of them will be described later) are sequentially stacked to form the layered structure C.

Note that a current blocking layer 6 consisting of a p type layer 6B and an n type layer 6A sequentially stacked is formed on both sides of the layered structure C.

Then, an upper cladding layer 2C is formed so as to bury the layered structure C and the current blocking layer 6, and a cap layer 5 made of p-InGaAsP with a thickness of 50 nm is further stacked thereon. An upper electrode 7B is formed on the cap layer 5 and a lower electrode 7A is formed on the rear surface of the substrate 1.

In the layered structure C described above, the active layer 4 is designed in the following manner.

That is, in the active layer 4, a well layer 4A is constituted of an InGaAsP layer with a thickness of 4 nm, a barrier layer 4B with a thickness of 10 nm is formed of InGaAsP with a composition having a bandgap wavelength of 1.2 $\mu$m, and a total of five quantum wells are provided (refer to FIG. 2).

On the other hand, the lower optical confinement layer 3A and the upper optical confinement layer 3B are designed in such a manner as follows.

That is, the thickness of the lower optical confinement layer 3A and the upper optical confinement layer 3B is set at 40 nm. With respect to the lower optical confinement layer 3A, a heterojunction part (1) with the lower cladding layer 2A is made of InGaAsP with a composition having a bandgap wavelength of 0.92 $\mu$m, and a heterojunction part (2) with the first well layer 4A of the active layer 4 is made of InGaAsP with a composition having a bandgap wavelength of 1.2 $\mu$m.

Furthermore, in the region between the part (1) and the part (2), the bandgap wavelength is sequentially increased from 0.92 $\mu$m to 1.2 $\mu$m. More specifically, this part of the layer is formed by the sequential stack of the InGaAsP with such a composition that the bandgap energy is sequentially decreased and the refraction index is sequentially increased.

Thus, as shown in FIG. 2, the lower optical confinement layer 3A is formed of InGaAsP with such a graded composition that the bandgap wavelength thereof is linearly increased from the lower cladding layer 2A to the first well layer 4A of the active layer 4.

Also, the configuration of the upper optical confinement layer 3B is designed to be reversal to that of the lower optical confinement layer 3A with respect to the active layer 4 serving as the center thereof.

That is, the heterojunction part with the last well layer 4A of the active layer 4 is formed of InGaAsP with a composition having a bandgap wavelength of 1.2 $\mu$m, and the heterojunction part with the upper cladding layer 2B is formed of InGaAsP with a composition having a bandgap wavelength of 0.92 $\mu$m. Thus, the layer between the parts is formed of InGaAsP with such a graded composition that the bandgap wavelength is sequentially and linearly decreased.

In the manufacture of the above-mentioned laser device, the MOCVD method is usually employed. For example, TMIn (trimethylindium) is used as In source, TMGa (trimethylgallium) is used as Ga source, $AsH_3$ (arsine) is used as As source, and $PH_3$ (phosphine) is used as P source. Then, these gas sources are diluted with $H_2$ to a predetermined concentration, and these gas sources are subjected to accurate flow rate control and time control by means of the mass flow controller in accordance with the kind of the semiconductor layers to be formed, then they are supplied to a reactor, and thus, sequentially forming predetermined semiconductor layers.

For example, the above-described lower optical confinement layer 3A in the layered structure C can be formed in such a manner as follows.

After the process of forming the lower cladding layer made of n-InP by the use of TMIn (In source), $PH_3$ (P source), and n type impurity gas source, the supply of the n impurity gas source is stopped. Next, while maintaining the supply of the In source and the P source, the mass flow controller of TMGa (Ga source) and that of $AsH_3$ (As source) are opened to start the supply of the Ga source and the As source to the reactor.

Then, the openings of the valves of the mass flow controllers of the In source and the P source are controlled to gradually reduce the supply flow rate thereof, and the supply flow rates of the Ga source and the As source are gradually increased from 0 by controlling the valves of the mass flow controllers thereof. Note that the supply flow rates of these gas sources are controlled to a certain value so that the composition of the InGaAsP layer formed at each time can be equal to the composition having a designed bandgap wavelength shown in FIG. 2.

Through the operations as described above, the lower optical confinement layer 3A made of InGaAsP, in which the composition ratio of In, Ga, As, and P is continuously changed is formed on the lower cladding layer 2A.

Note that the upper cladding layer 3B can be formed by the operations reverse to those of the lower cladding layer 3A after forming the active layer 4.

Figure 3:
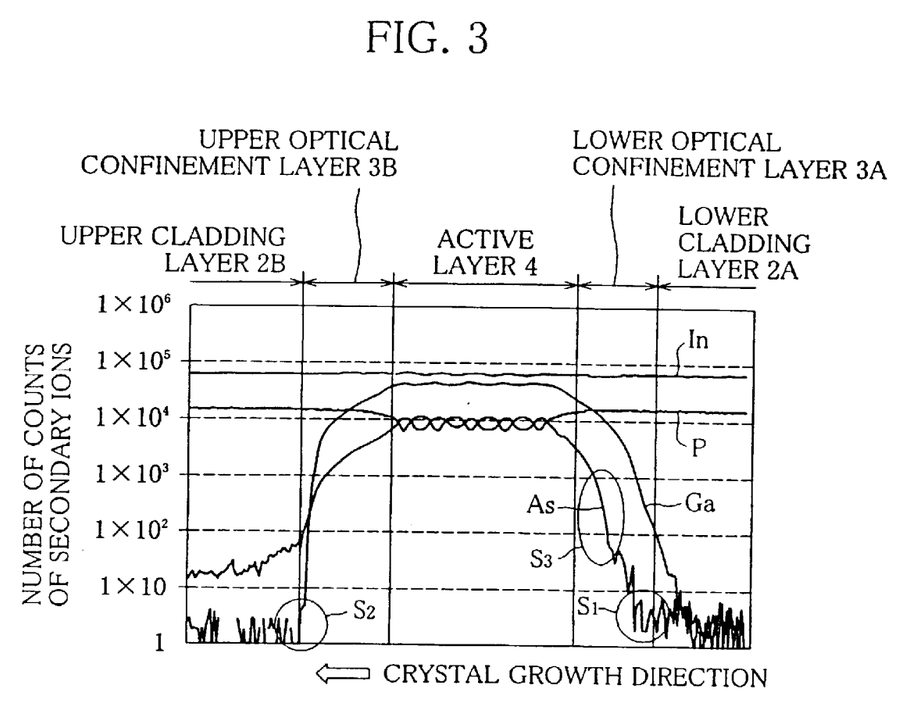
FIG. 3 is a profile showing the result of the SIMS for In, Ga, As, and P in the conventional layered structure C.

FIG. 3 shows the result of the secondary ion mass-spectroscopy (SIMS) for the layered structure obtained in the fabrication of the laser device through the above-described operations using the MOCVD method, which is designed so as to achieve the energy band diagram shown in FIG. 2.

In FIG. 3, the vertical axis represents the number of counts of the secondary ions of each element, and the horizontal axis represents the positions of the respective layers in the layered structure C.

As is apparent from the SIMS curve shown in FIG. 3, the number of counts of the secondary ions with respect to the Ga source and the As source are unstably fluctuated in the regions of the small supply flow rates thereof.

More specifically, it has been found out from FIG. 3 that, in the case of the crystal growth of mixed crystals having a certain composition by the MOCVD method, the composition ratio of the component elements in the formed crystal layer is unstable during the time when the supply flow rate of a component element (As in the case of FIG. 3) is small.

Particularly, in the case of the SIMS curve relative to As, the number of counts become remarkably unstable in an early stage $S_1$ in the formation of the lower optical confinement layer 3A. More specifically, the number of counts does not smoothly increase but significantly fluctuate in the lower optical confinement layer 3A. And then, the SIMS curve becomes steep at the time when the crystal growth reaches a certain thickness as indicated by $S_3$ in FIG. 3.

In addition, the number of counts of As secondary ions sharply decreases at the point $S_2$ close to the junction between the upper optical confinement layer 3B and the upper cladding layer 2B.

It can be understood from the foregoing description that the stable formation of the crystal layer in line with the design cannot be achieved. Accordingly, the improvement in the carrier injection efficiency and the crystallinity intended in the design stage cannot be expected. On the contrary, the deterioration in such characteristics may be caused.

In addition, when such situations occur, the refraction index of the upper and lower optical confinement layers deviates from the design standard, and the condition in the optical confinement in the active layer is disadvantageously changed.

OBJECT AND SUMMARY OF THE INVENTION

An object of the present invention is to provide a semiconductor laser device provided with a layered structure in which composition ratio in the formed crystal layer is stable even in a region where a supply flow rate of a component element is small, and improvement in the carrier injection efficiency and crystallinity can be achieved.

Another object of the present invention is to provide a method of manufacturing the semiconductor laser device.

In order to achieve the objects, the present invention provides a semiconductor laser device, provided with a layered structure in which a lower cladding layer, a lower optical confinement layer, an active layer having a quantum well structure, an upper optical confinement layer, and an upper cladding layer are stacked in this order on a substrate, wherein both the lower optical confinement layer and the upper optical confinement layer are made of mixed crystals of compound semiconductors with a composition continuously changed in a thickness direction, and a crystal layer (hereinafter, referred to as an interposition layer and referred to as a minute flow rate controllable layer in claims) obtained as a result of the control of the supply flow rate of the minute gas source is interposed in at least one of the interfaces between the lower cladding layer and the lower optical confinement layer, between the lower optical confinement layer and the active layer, between the active layer and the upper optical confinement layer, and between the upper optical confinement layer and the upper cladding layer.

In a preferable aspect, the present invention provides a semiconductor laser device in which both the lower optical confinement layer and the upper optical confinement layer are made of the four-element mixed crystals with a composition continuously changed in a thickness direction, and a layer made of the four-element mixed crystals with a composition having a bandgap wavelength of 0.93 to 1.05 µm is interposed at least between the lower optical confinement layer and the lower cladding layer.

In addition, the present invention provides a method of manufacturing a semiconductor laser device, which is provided with a layered structure in which a lower cladding layer, a lower optical confinement layer made of mixed crystals of compound semiconductors with a composition continuously changed in a thickness direction, an active layer having a quantum well structure, an upper optical confinement layer made of mixed crystals of compound semiconductors with a composition continuously changed in reverse to that of the lower optical confinement layer with respect to the active layer, and an upper cladding layer are stacked in this order on a substrate, wherein each of the layers in the layered structure is formed by the metalorganic chemical vapor deposition apparatus, in which the source gases are supplied to the reactor while controlling the supply flow rates of the gas sources of the component elements by the mass flow controller, and in the case where the supply flow rate of the gas source is smaller than the controllable limit of the flow rate of the mass flow controller, the method includes the step of: supplying the gas source previously flowed in the exhaust path with the flow rate controllable by the mass flow controller to the reactor, alternatively, stopping the supply of the gas source and then supplying gas source of the component element of the layer formed in the next process to the reactor.

More specifically, the present invention provides a method of manufacturing a semiconductor laser device (hereinafter, referred to as the first manufacturing method), in which, the gas source of the element which is not used in the formation of the lower cladding layer is previously flowed in the exhaust path until the time when the formation of the lower optical confinement layer is started, and at the same time of the start of the formation of the lower optical confinement layer, the gas source is supplied to the reactor.

Alternatively, the present invention provides a method of manufacturing a semiconductor laser device (hereinafter, referred to as the second manufacturing method), in which, at the time reaching the completion of the formation of the lower optical confinement layer and when the flow rate of the supplied gas source is smaller than the controllable limit of the flow rate of the mass flow controller, the supply of the gas source is stopped, and then, the gas sources of the component elements of the active layer are supplied to the reactor.

DETAILED DESCRIPTION

Figure 4:
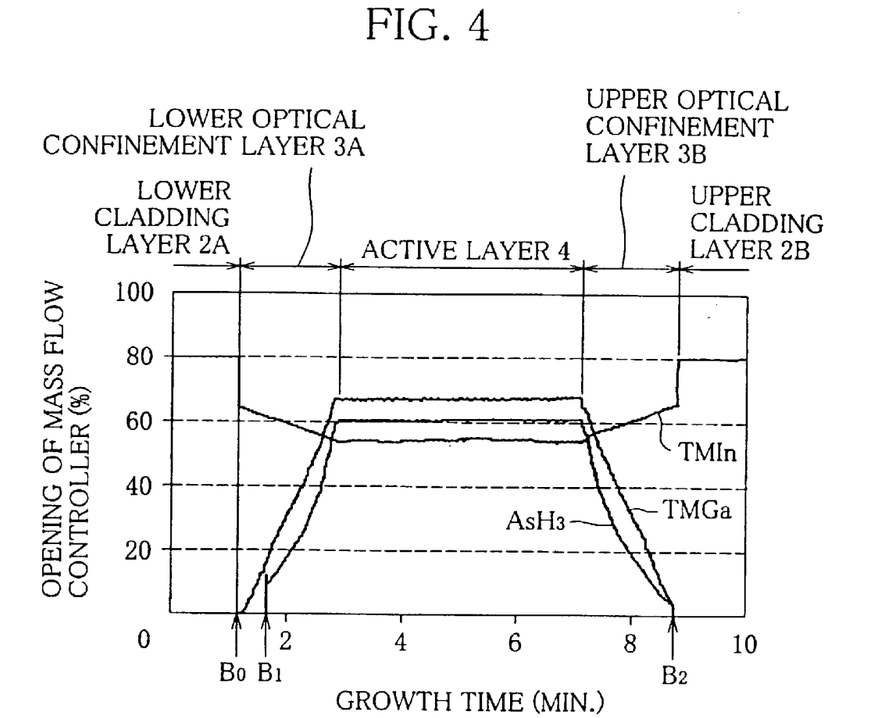
FIG. 4 is a graph showing the supplying state of TMIn, TMGa, and $AsH_3$ in the process of forming the conventional layered structure C.

For the investigation of the causes of the phenomenon shown in FIG. 3, the inventors of the present invention has examined the change in the supply flow rates of the In source, Ga source, and As source in the formation of the layered structure C. FIG. 4 shows the result obtained in the examination.

As is apparent from FIG. 4, a discriminative phenomenon can be found in the supply flow rate of the As source during the formation of the lower optical confinement layer 3A.

The process of forming the lower optical confinement layer 3A is started by opening the valve of the mass flow controllers of the Ga source and the As source at the time $B_0$ shown in FIG. 4.

In this case, the Ga source is supplied to the reactor immediately after the opening of the valve, and the supply flow rate thereof is increased in proportion to the increase of the opening of the mass flow controller.

However, the As source does not flow for a while after the opening of the valve of the mass flow controller, and the supply flow rate remains 0. Then, the As source suddenly starts to flow at the time $B_1$ some amount of time later, and thereafter, the supply flow rate thereof is increased in proportion to the increase of the opening of the mass flow controller.

More specifically, with respect to the supply flow rate of the As source, when opening the mass flow controller, a certain time lag occurs between the valve opening and the supply flow rate. This is probably because (the designed value of) the supply flow rate of the As source immediately after the opening of the mass flow controller is smaller than the lower limit of the controllable flow rate of the mass flow controller.

It can be determined that this is the factor for forming the shape of the SIMS curve representing As in the lower optical confinement layer 3A shown in FIG. 3. More specifically, even if the mass flow controller is opened, the As source does not flow until the time $B_1$. Therefore, the number of counts of the measured As secondary ions shown in FIG. 3 is small, and the number of counts thereof fluctuates as shown by $S_1$. In addition, since the As source suddenly starts to flow after the time $B_1$, the curve representing the number of counts of the As secondary ions shows a steep gradient.

In addition, in FIG. 4, at the time $B_2$ when the formation of the upper optical confinement layer 3B is finished, the supply flow rate of the $AsH_3$ suddenly decreases. As a result, the number of counts of the As secondary ions is also suddenly decreased as indicated by $S_2$ in FIG. 3.

Figure 5:
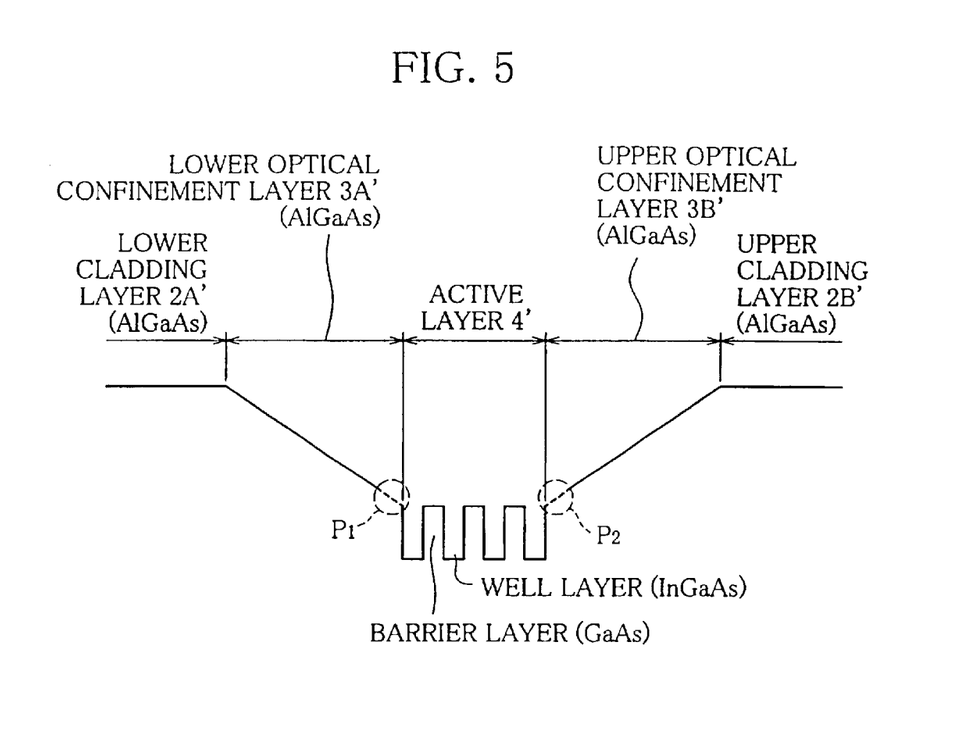
FIG. 5 is a bandgap energy diagram of another conventional layered structure C.

The layered structure shown in FIG. 5 illustrates another case in which the flow rate control of the supply gas source by the mass flow controller is extremely difficult due to the very small amount of supply flow rate of the supply gas source, and as a result, the graded compositions of the lower optical confinement layer and the upper optical confinement layer are deviated from the design values.

This layered structure is composed of a lower cladding layer 2A' made of AlGaAs, a lower optical confinement layer 3A' made of AlGaAs with a graded composition, an active layer 4' having a quantum well structure in which barrier layers are made of GaAs and well layers are made of InGaAs, an upper optical confinement layer 3B' made of AlGaAs with a graded composition, and an upper cladding layer 2B' made of AlGaAs.

Also, the lower optical confinement layer 3A' and the upper optical confinement layer 3B' are designed so that the bandgap energy thereof is continuously changed from the lower (upper) cladding layer to the barrier layer.

In addition, the Al source used in the formation of the layered structure is usually TMAl (trimethyl aluminum).

When forming the lower optical confinement layer 3A' in this layered structure, the designed flow rates of the Al source, the Ga source, and the As source are supplied from the respective mass flow controllers to the reactor. In this case, the supply flow rate of the Al source is gradually decreased.

Therefore, at the time close to the completion of the formation of the lower optical confinement layer 3A' (region $P_1$ enclosed by the dotted line in FIG. 5), the supply flow rate of the Al source is approximately 0, which is smaller than the controllable limit of the flow rate of the mass flow controller. As a result, the supply flow rate of the Al source fluctuates in disorder.

Accordingly, the composition in the region $P_1$ deviates from the graded composition set as the target in design stage, which can be observed also in the region $P_2$.

The present inventors contemplated following measures for the two cases.

First, with respect to As for the lower optical confinement layer 3A and the upper optical confinement layer 3B in FIG. 3, if a predetermined flow rate of the As source can start to flow immediately after the opening of the valve of the mass flow controller of the As source, the smooth and stable change of the As source can be achieved even in the region where the supply flow rate of As is small.

For its achievement, the As source at a flow rate larger than the lower limit of the controllable flow rate of the mass flow controller is previously flowed to a flow path other than that connected to the reactor, and the flow path of the As source is switched to the reactor at the time $B_0$ when the process for forming the lower optical confinement layer 3A is started, and thereafter, the opening of the mass flow controller is sequentially increased. By doing such operation, it is possible to prevent the case shown in FIG. 4 where the flow rate of the As source remains 0 until the time $B_1$.

In this case, however, since a certain flow rate of the As source is supplied to the reactor simultaneously with the opening of the valve of the mass flow controller, InGaAsP having a composition corresponding to the supply flow rate of the As source is grown to a certain thickness at a heterojunction part between the lower optical confinement layer 3A and the lower cladding layer 2A or in the interface therebetween, and the layer exists as an interposition layer.

In addition, for the solution of the disorder of the composition in the region $P_1$ shown in FIG. 5, the supply of the Al source is stopped at the time when the supply flow rate of the Al source falls below the lower limit of the controllable flow rate of the mass flow controller, and then switched to the supply of the gas source for forming the barrier layer in the active layer instead of the Al source. By such operation, the disorder of the composition in the region $P_1$ can be solved. Similarly, the solution of the disorder of the composition in the region $P_2$ shown in FIG. 5 can be achieved by the application of the method for solving the problem shown in FIG. 3.

The present invention relates to a semiconductor laser device and a method of manufacturing the same based on the knowledge and consideration as described above.

First, a laser device manufactured in accordance with the first manufacturing method will be described. In this laser device, the entire layered structure on the substrate has a configuration similar to that shown in FIG. 1. However, the laser device is different from that shown in FIG. 1 in that an interposition layer 3a with a certain thickness, which is made of four-element mixed crystals similar to that used in the lower optical confinement layer 3A but consists of a certain composition having a bandgap wavelength of 0.93 to 1.05 μm, is formed between the lower optical confinement layer 3A and the lower cladding layer 2A.

Also, an interposition layer 3b having the same thickness and the composition as those of the interposition layer 3a can be interposed between the upper optical confinement layer 3B and the upper cladding layer 2B.

Figure 6:
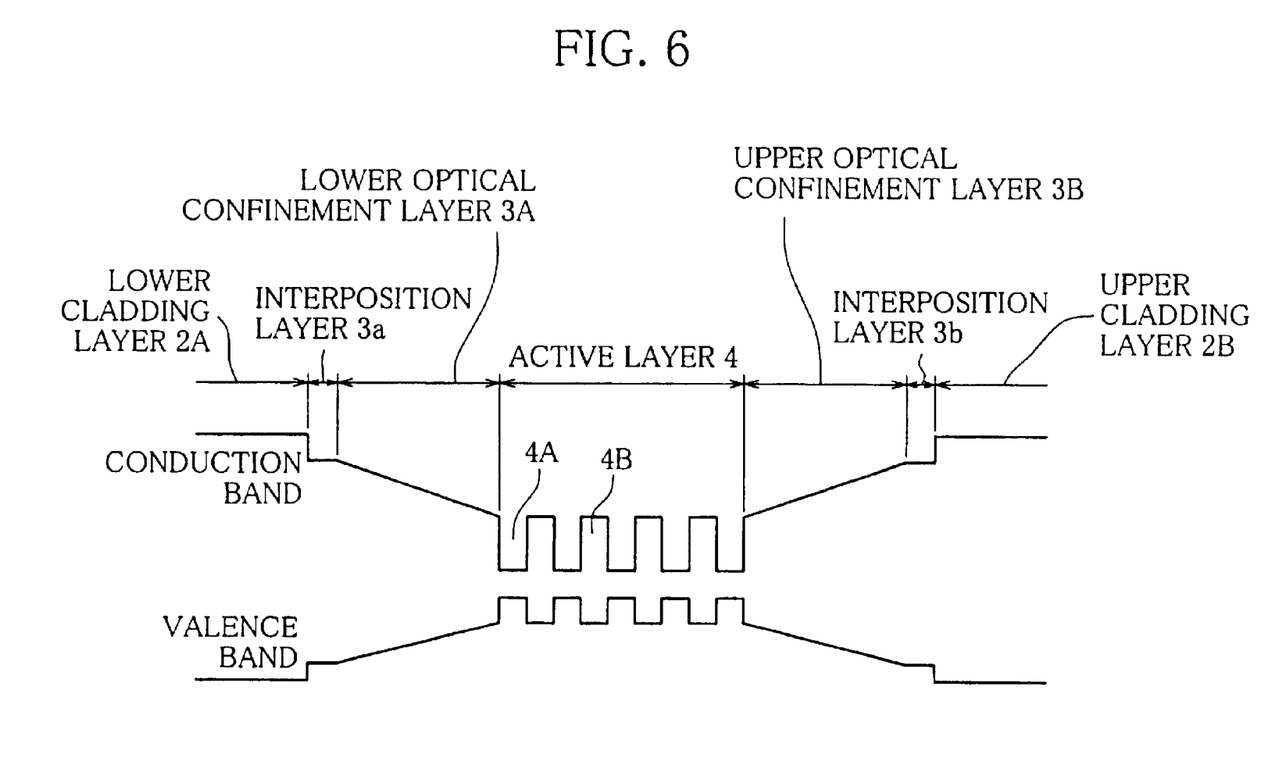
FIG. 6 is a bandgap energy diagram of the layered structure in the laser device in the present invention.

Accordingly, the energy band diagram of the layered structure C in the laser device according to the present invention is like that shown in FIG. 6.

The process for forming the interposition layer 3a and the lower optical confinement layer 3A in this layered structure will be described as follows. In the following description, the upper and lower optical confinement layers are constituted of InGaAsP.

As described above, in the previous step of the start of the formation of the lower optical confinement layer 3A, the lower cladding layer 2A made of n-InP has been already formed by the use of the In source and the P source. Then, in addition to the In source and the P source, the Ga source and the As source are supplied to the reactor with the supply flow rates thereof being controlled by the mass flow controllers, thereby starting the process of forming the lower optical confinement layer 3A.

Figure 7:
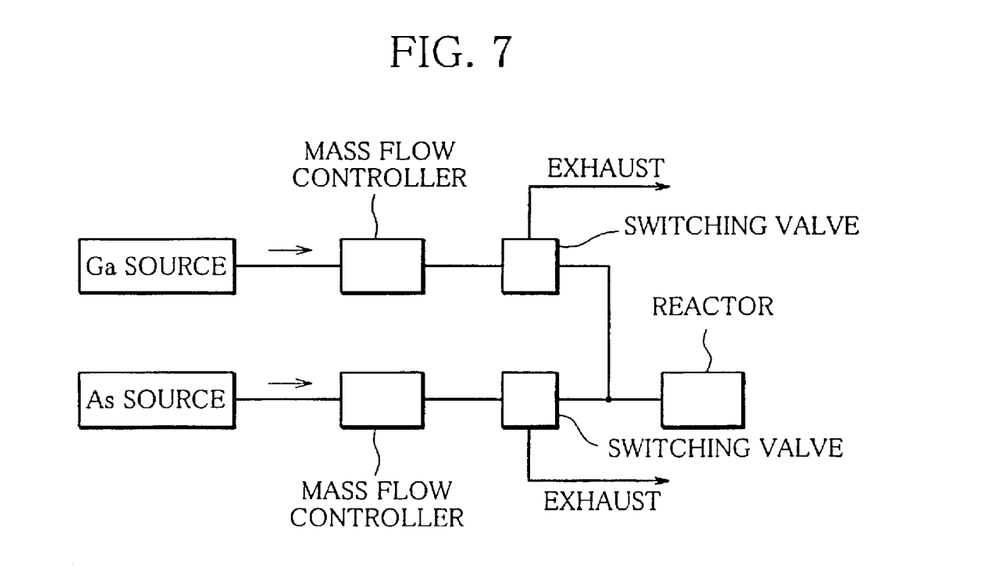
FIG. 7 is a schematic diagram showing the supply system of the Ga source and the As source used in the present invention.

In the present invention, a supply system of the Ga source and the As source is assembled as shown in FIG. 7 in which a switching valve is provided in the flow path between the mass flow controller and the reactor, and the operations given below are performed through the above-described processes.

For example, during the process of forming the lower cladding layer 2A, the respective mass flow controllers are opened, and simultaneously, the switching valves are controlled so as to continue the flow of the Ga source and the As source towards the exhaust path from the mass flow controllers thereof. The flow rates of the Ga source and the As source at this time are set larger than the lower limit of the controllable flow rate of the respective mass flow controllers.

Then, the switching valve is switched at the same time of the start of the process of forming the lower optical confinement layer 3A, thereby supplying the Ga source and the As source to the reactor.

Both the flow rates of the Ga source and the As source at this time are larger than the lower limit of the controllable flow rate of the mass flow controllers. Therefore, the flow rates in the exhaust path are maintained and the sources are supplied to the reactor. More specifically, with respect to the As source, the stop of supply thereof at the point $B_1$ shown in FIG. 4 is prevented.

Thereafter, the supply flow rates of the Ga source and the As source are gradually increased by further opening the valve of the mass flow controllers, thereby forming the lower optical confinement layer 3A with a composition continuously changed in the thickness direction.

In this case, at the previous step of the start of the formation of the lower optical confinement layer 3A, the Ga source and the As source at the exhaust flow rates are being supplied to the reactor. Therefore, the interposition layer 3a with a certain thickness made of InGaAsP is formed by these gas sources on the lower cladding layer 2A, and thus, the interposition layer 3a is provided in the interface between the lower cladding layer 2A and the lower optical confinement layer 3A.

Note that, since the supply flow rates of the respective gas sources are considerably larger than the lower limit of the controllable flow rate of the mass flow controller, the interposition layer 3b can be formed by decreasing the openings of the respective mass flow controllers to a predetermined range.

Figure 8:
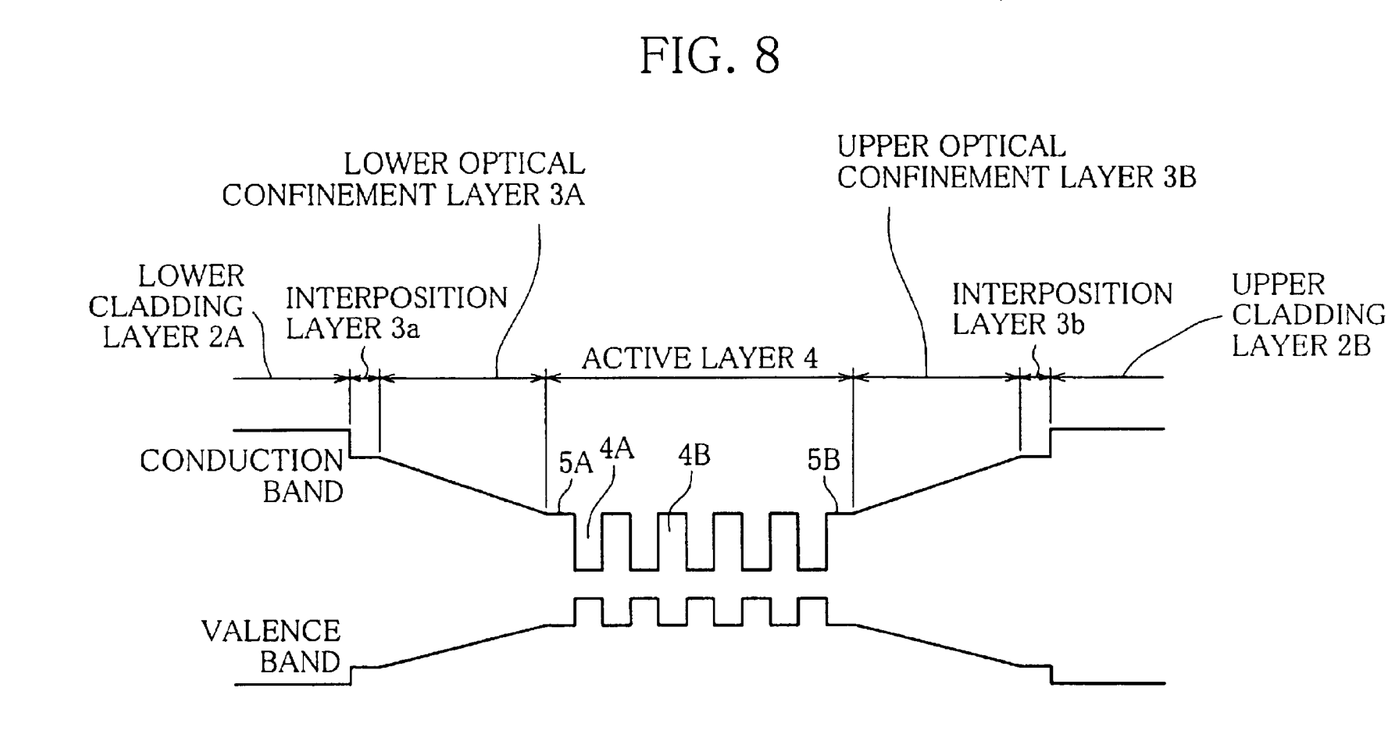
FIG. 8 is another bandgap energy diagram of another layered structure in the present invention.

Furthermore, as shown in the bandgap energy diagram of FIG. 8, it is also preferable to form barrier steps 5A and 5B made of the same material and having the same thickness as those of the barrier layer 4B in the interface between the lower optical confinement layer 3A and the well layer 4A and the interface between the upper optical confinement layer 3B and the well layer 4A during the formation of the layered structure.

In the second manufacturing method, the supply of the Al source to the reactor is stopped at the time when the supply flow rate of the Al source falls below the lower limit of the controllable flow rate of the mass flow controller during the process of forming the lower optical confinement layer 3A' shown in FIG. 5, and then switched to the supply of the gas sources (Ga source and As source) for forming the barrier layer (GaAs) in the active layer.

Figure 9:
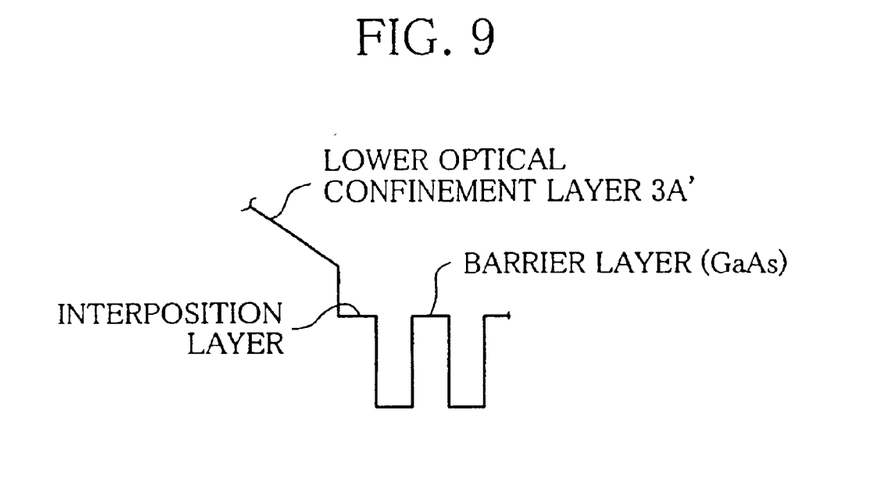
FIG. 9 is still another bandgap energy diagram of the heterojunction part between the lower optical confinement layer and the active layer in the present invention.

As a result, as shown in FIG. 9, a barrier layer made of GaAs is formed at the region $P_1$. Here, the composition of the lower optical confinement layer 3A' up to the region $P_1$ is equivalent to the composition set as a target in the design stage, and the composition of the barrier layer in the region $P_1$ is GaAs having a particular composition. Therefore, the structure has a stable characteristic as a whole.

Figure 10:
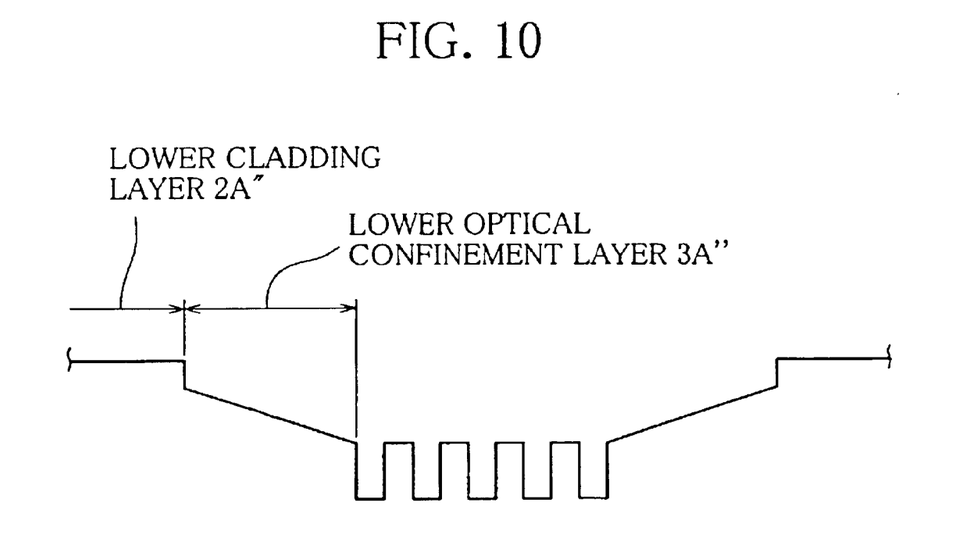
FIG. 10 is further still another bandgap energy diagram of the heterojunction part between the lower optical confinement layer and the active layer in the present invention.

Also, with the second manufacturing method, a layered structure having energy bands as shown in FIG. 10 can be formed.

In this case, in the process of formation of the lower cladding layer 2A", the gas sources (Ga source, As source, and Al source) for the lower optical confinement layer 3A" are kept to flow to the exhaust path at predetermined rates. Then, simultaneously with completion of the formation of the lower cladding layer 2A", the supply of gas sources to the reactor is switched such that the gas sources for the lower optical confinement layer 3A", which had been made to flow to the exhaust path until then, are supplied to the reactor.

As a result, the formation of the lower optical confinement layer 3A" starts immediately following the lower cladding layer 2A", as shown in FIG. 10.

A similar operation is performed also with respect to the lower optical confinement layer 3A" and the first well layer, whereby the well layer can be formed directly following the lower optical confinement layer 3A", as shown in FIG. 10.

EXAMPLE

A laser device having a layered structure composed of the following components was designed.

Substrate 1: n-InP.
Lower cladding layer 2A: n-InP, thickness of 500 nm.
Interposition layer 3a: InGaAsP with a bandgap wavelength of 0.95 µm, thickness of 3 nm.
Lower optical confinement layer 3A: InGaAsP with a composition having a bandgap wavelength continuously changed from 0.95 µm to 1.2 µm in the stacking direction, entire thickness of 40 nm.
Active layer 4: composed of a well layer made of InGaAsP having a thickness of 4 nm and a barrier layer made of InGaAsP with a composition having a bandgap wavelength of 1.2 µm and having a thickness of 10 nm, the number of wells is five.
Upper optical confinement layer 3B: InGaAsP with a composition having a bandgap wavelength continuously changed from 1.2 µm to 0.95 µm in the stacking direction, entire thickness of 40 nm.
Interposition layer 3b: InGaAsP with a bandgap wavelength of 0.95 µm, thickness of 3 nm.
Upper cladding layer 2B: p-InP, thickness of 500 nm.
Upper cladding layer 2C: p-InP, thickness of 3.5 µm.
Cap layer 5: p-InGaAsP with a composition having a bandgap wavelength of 1.2 µm, thickness of 50 nm.
Current blocking layer 6A: n-InP, thickness of 1.5 µm.
Current blocking layer 6B: p-InP, thickness of 0.9 µm.

For the formation of the layered structure composed of the above-described components, TMGa (Ga source) and $AsH_3$ (As source) are supplied to the reactor by using the supply system shown in FIG. 7. The state of TMGa, $AsH_3$, and TMIn (In source) supplied are shown in FIG. 11.

Figure 11:
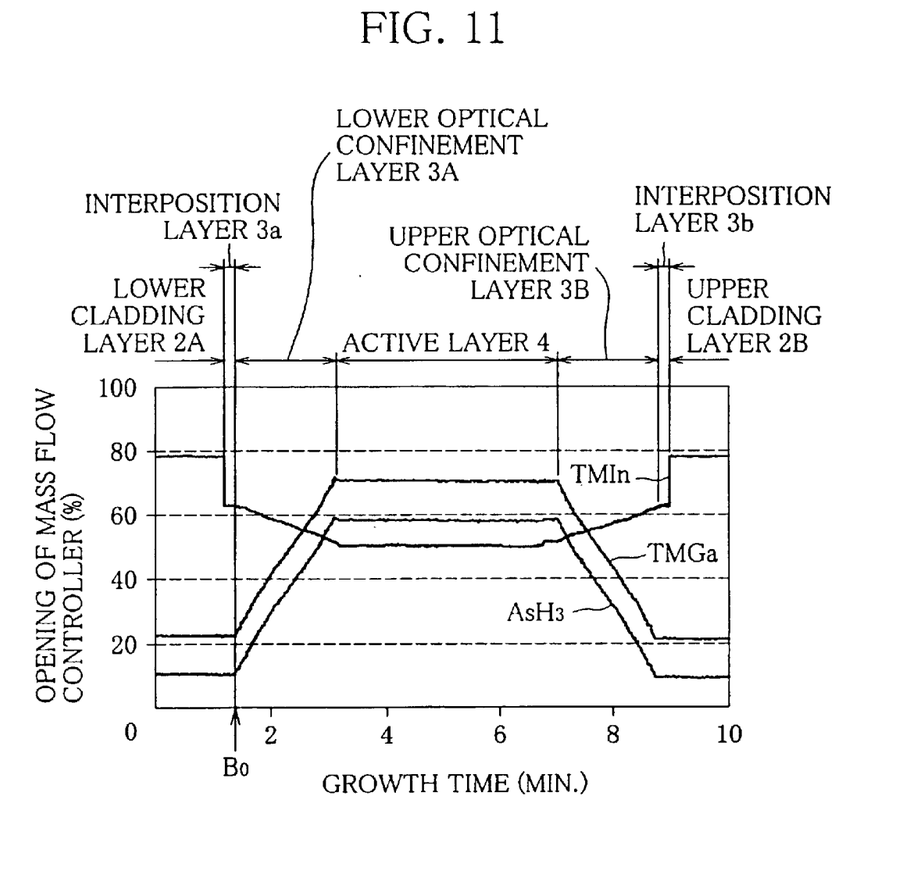
FIG. 11 is a graph showing the supplying state of TMIn, TMGa, and $AsH_3$ in Example.

As is apparent from FIG. 11, in this example, TMGa is continuously flowed to the exhaust path at a flow rate obtained by setting the opening of the mass flow controller at about 22% and $AsH_3$ is continuously flowed to the exhaust path at a flow rate obtained by setting the opening of the mass flow controller at about 10% until the time ($B_0$) when the formation of the lower optical confinement layer 3A is started. At the same time with the start of forming the lower optical confinement layer 3A, TMGa and $AsH_3$ are supplied to the reactor while maintaining the flow rates, and then, the openings of the mass flow controllers are gradually increased to increase the supply flow rate to the reactor.

The SIMS was performed for the layered structure of the laser device manufactured by supplying the gas sources in accordance with the manner as shown in FIG. 11. The result thereof is shown in FIG. 12.

Figure 12:
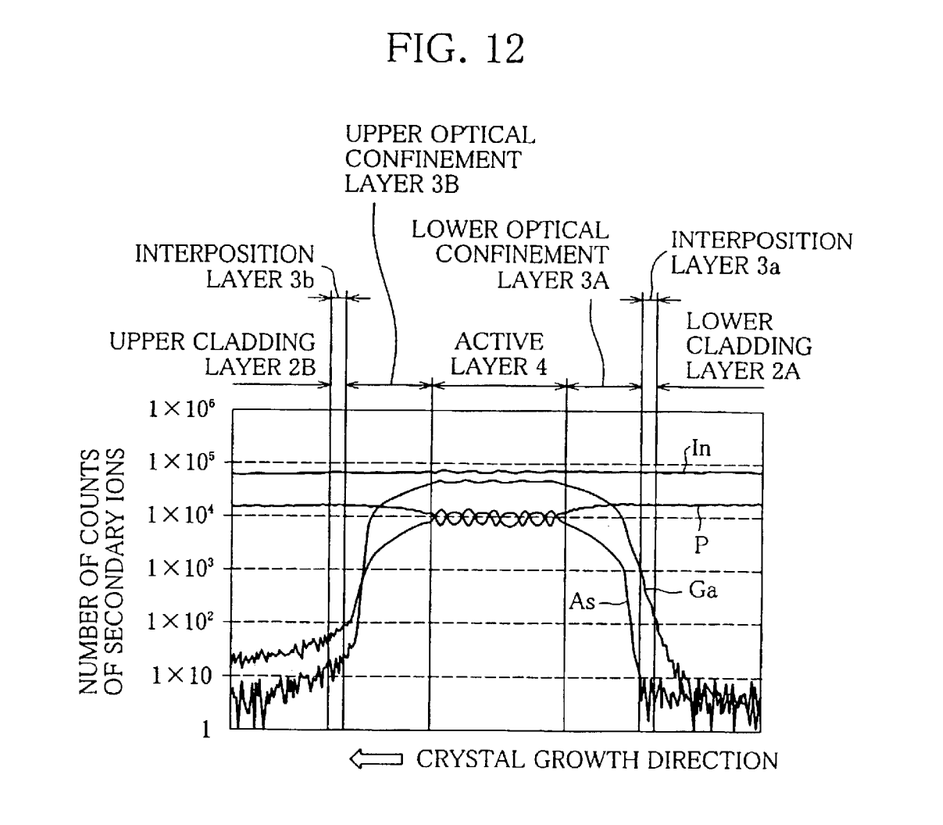
FIG. 12 is a profile showing the result of the SIMS for In, Ga, As, and P in the layered structure obtained in the example.

As is apparent from FIG. 12, the SIMS profiles of the lower optical confinement layer 3A and the upper optical confinement layer 3B show that supply delay and fluctuation are reduced in comparison to the case shown in FIG. 3 and such a case where the flow rate become lower than a certain flow rate and the supply is stopped is prevented in the region of small supply flow rate of the As source. Therefore, the layered structure shown in FIG. 1 is equivalent to the layered structure in accordance with the design values, and the layered structure can obtain the energy band diagram as shown in FIG. 6.

As is apparent from the foregoing descriptions, the semiconductor laser device according to the present invention is characterized in that the composition of the semiconductor material used in the lower optical confinement layer and the upper optical confinement layer is continuously changed in the thickness direction, and a layer made of the same kind of semiconductor material as that of the lower optical confinement layer having a bandgap wavelength of 0.93 to 1.05 µm is interposed at least between the lower cladding layer and the lower optical confinement layer.

Thus, the laser device according to the present invention can form a stable crystal layer even in the region where the supply flow rate of the component element is small. Therefore, it is possible to enhance the carrier injection efficiency and the crystallinity.

What is claimed is:
1. A semiconductor laser device comprising:
a lower cladding layer;
a lower optical confinement layer comprising compound semiconductors with a composition continuously changed in a thickness direction;
an active layer having a quantum well structure;
an upper optical confinement layer comprising compound semiconductors with a composition continuously changed in a thickness direction;
an upper cladding layer; and
a minute flow rate controllable layer obtained as a result of the control of said flow rate of supplying the minute gas source, said minute flow rate controllable layer is interposed in the interfaces between said lower cladding layer and said lower optical confinement layer, between at least one of (1) said lower optical confinement layer and said active layer, (2) said active layer and said upper optical confinement layer, and (3) said upper optical confinement layer and said upper cladding layer, said lower optical confinement layer and said upper optical confinement layer comprising quaternary compound semiconductors with a composition continuously changed in a thickness direction; and said minute flow rate controllable layer comprising said quaternary compound semiconductors with a composition having a bandgap wavelength of 0.93 to 1.05 $\mu$m interposed at least between said lower optical confinement layer and said lower cladding layer.

2. The semiconductor laser device of claim 1, wherein said quaternary compound semiconductors comprise InGaAsP.

3. The semiconductor device of claim 1, wherein the oscillation wavelength band thereof is in a range of 1.3 to 1.6 $\mu$m.

4. The semiconductor device of claim 2, wherein the oscillation wavelength band thereof is in a range of 1.3 to 1.6 $\mu$m.

* * * * *